(12) United States Patent
French et al.

(10) Patent No.: US 7,751,188 B1
(45) Date of Patent: Jul. 6, 2010

(54) METHOD AND SYSTEM FOR PROVIDING COOLING OF COMPONENTS IN A DATA STORAGE SYSTEM (75) Inventors: F. William French, Harvard, MA (US); Sheldon Joel Gilden, Sharon, MA (US); Arthur R. Nigro, Jr., Hopkinton, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/824,387

(22) Filed: Jun. 29, 2007

(51) Int. Cl.
*H05K 7/20* (2006.01)

(52) U.S. Cl. .................. 361/691; 361/688; 361/695; 62/5; 62/259.2; 165/104.33

(58) Field of Classification Search ......... 361/687–691, 361/694, 717–719, 695, 699; 165/80.3, 104.33, 165/104.21; 62/5, 259.2, 89, 238.2; 454/184
See application file for complete search history.

(56) References Cited

U.S. PATENT DOCUMENTS

| 3,654,768 | A | * | 4/1972 | Inglis et al. .................. 62/5 |
| 4,848,090 | A | * | 7/1989 | Peters .......................... 62/3.3 |
| 6,108,206 | A | * | 8/2000 | Criniti et al. .................. 361/704 |
| 6,401,463 | B1 | * | 6/2002 | Dukhan et al. ................ 62/5 |
| 6,990,817 | B1 | * | 1/2006 | Bhatia .......................... 62/5 |
| 7,263,836 | B2 | * | 9/2007 | Gunawardana et al. ......... 62/5 |
| 2005/0168945 | A1 | * | 8/2005 | Coglitore ....................... 361/695 |
| 2006/0150643 | A1 | * | 7/2006 | Sullivan ........................ 62/89 |

FOREIGN PATENT DOCUMENTS

DE 3316978 A1 * 11/1994

* cited by examiner

*Primary Examiner*—Jayprakash N Gandhi
*Assistant Examiner*—Courtney Smith
(74) *Attorney, Agent, or Firm*—Krishnendu Gupta; Scott A. Ouellette (57) ABSTRACT

A cooling method and system is disclosed which utilizes vortex tubes to generate and direct cold air over heat-generating components of an electronic system.

2 Claims, 8 Drawing Sheets

METHOD AND SYSTEM FOR PROVIDING COOLING OF COMPONENTS IN A DATA STORAGE SYSTEM

FIELD OF THE INVENTION

This invention relates generally to a method and system for providing cooling of electrical components and, more particularly, to a method and system for using vortex tubes to generate and direct cool air over heat-generating components of the data storage system.

BACKGROUND OF THE INVENTION

Critical to the proper operation of electronic systems is temperature control. The electronic components in these systems can generate much heat, which, unless quickly dissipated, can negatively affect the operational characteristics of those and other components and lead to system failure. As is known in the art, air is typically used to cool electronic components stored within system cabinets. One technique for such cooling is to mount a fan in an aperture in the top of such cabinets. Such a fan creates an air flow through the cabinet, cooling the housed electrical components.

However, since fans can only move ambient air over the electronic components, the ability of the fans to cool the components is limited. Also, as the power requirements of the components increases, the components generate increased amounts of heat that must be removed from the cabinet. This situation is exacerbated if one or more of the fans in the cabinet fails, which could result in a failure of components of the system.

SUMMARY OF THE INVENTION

The present invention is directed to a cooling method and system for utilizing vortex tubes to generate and direct cooled air over heat-generating components of the electronic system, for example, a data storage system. Compressed air is input to a vortex tube and the cool air output by the tube is directed to heat-generating components of the data storage system. Since the temperature of the cool air output by the vortex tube is well below the ambient air temperature, the cooling system is able to provide greater cooling to components of the system that require it. The cooling system enables spot cooling for components that generate the most heat, and can either supplement a fan-based cooling system or be utilizes as the sole cooling system. While fans consume high power, generate a lot of noise, and occupy a lot of space within the cabinet, the cooling system including vortex tubes only requires the input of compressed air, is much quieter than fans and requires a reduced amount of space within the cabinet.

BRIEF DESCRIPTION OF THE DRAWINGS

These and other features of the invention will become more readily apparent from the following detailed description when read together with the accompanying drawings, in which.

DETAILED DESCRIPTION

Figure 1:
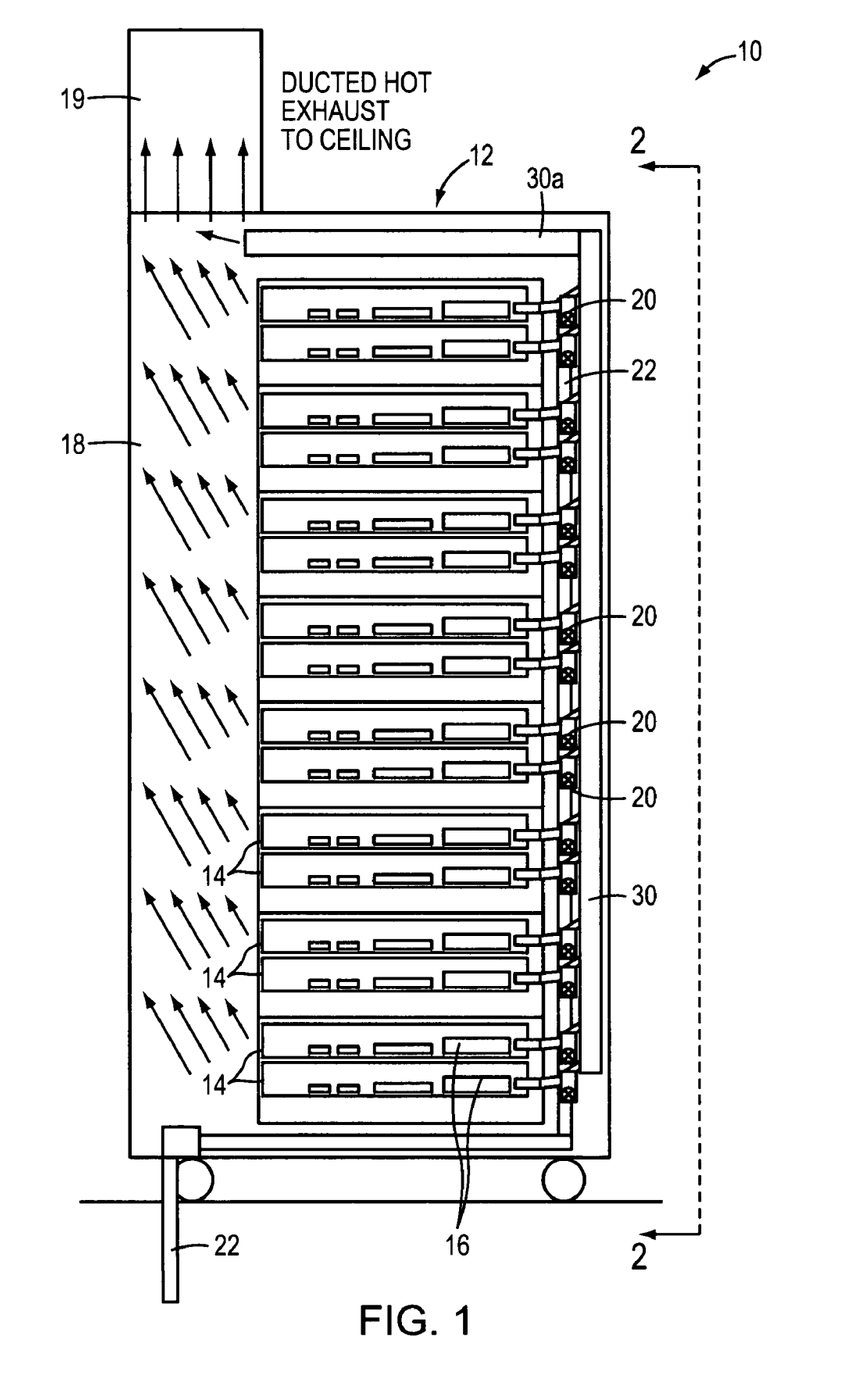
FIG. 1 is a diagram of a cross-sectional view, taken along line 1-1 of FIG. 2, of a cooling system for a data storage system, in accordance with the present invention.
Figure 2:
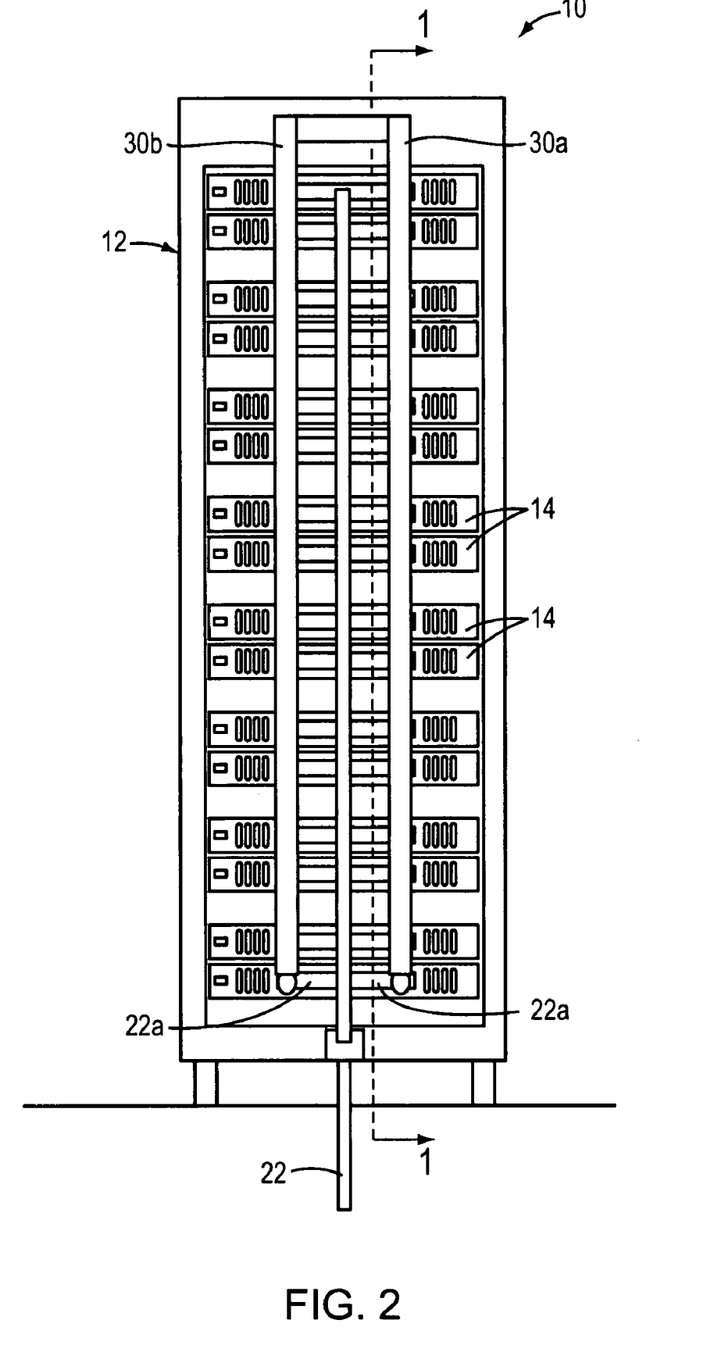
FIG. 2 is a diagram of a front view, as seen from line 2-2 of FIG. 1, of a cooling system for a data storage system in accordance with the present invention.

FIG. 1 is a diagram of a cross-sectional view, taken along line 1-1 of FIG. 2, of a cooling system for a data storage system 10 and FIG. 2 is a diagram of a front view, as seen from line 2-2 of FIG. 1, of the cooling system for the data storage system 10. Data storage system 10 includes a cabinet 12 housing a plurality of storage processor modules 14. Storage processor modules 14 include a number of components for processing data read and write commands between a host computer and data storage devices (not shown), including central processing units ("CPU"). In one embodiment, each module 14 includes two CPUs. Since FIG. 1 is a cross-sectional view of the system 10, only one CPU 16 of each module 14 can be seen. Cabinet 12 includes a chimney section 18 through which heat generated by the components is directed out of the cabinet through a duct 19.

The cooling system utilizes a plurality of vortex tube devices 20, each for directing cold air at the heat-generating components of the storage processor module 14, and particularly at a CPU 16 on a module 14. An example of a vortex tube device that may be used in the system is the Model #3204 vortex tube, available from Exair Corporation of Cincinnati, Ohio. As is known in the art, a vortex tube is a mechanical device that separates a compressed gas into hot and cold streams. It has no moving parts. Pressurized gas is injected into a swirl chamber and accelerates to a high rate of rotation. Due to a conical nozzle at the end of the tube, only the outer shell of the compressed gas, comprising hot air, is allowed to escape at that end. The remainder of the gas, comprising cold air, is forced to return in an inner vortex of reduced diameter within the outer vortex, and escapes from the opposite end of the tube. The vortex tube device requires no external power, other than the air that is input to it.

Figure 3A:
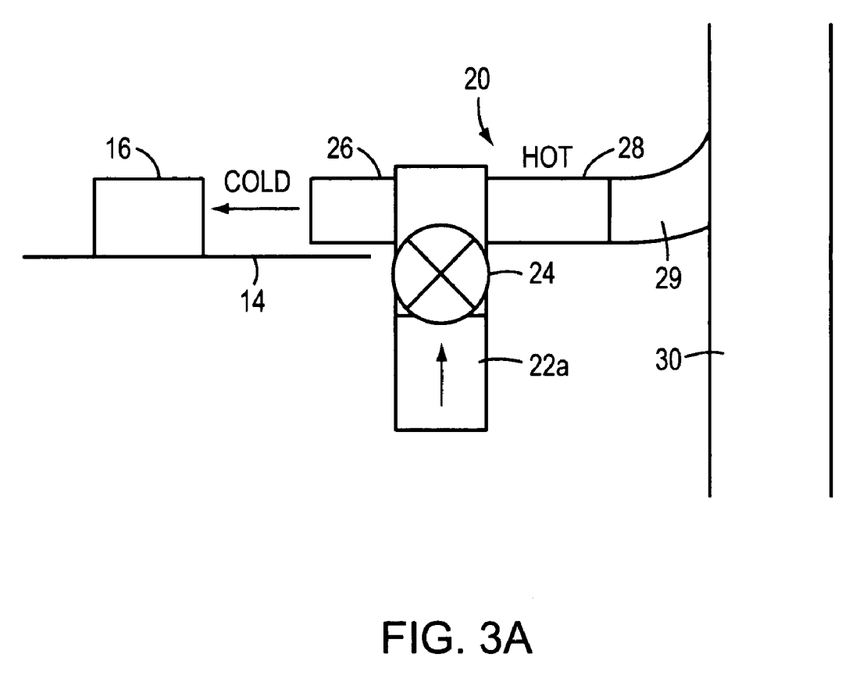
FIGS. 3A and 3B are diagrams of different embodiments of vortex tubes utilized in the cooling system for a data storage system in accordance with the present invention.
Figure 3B:
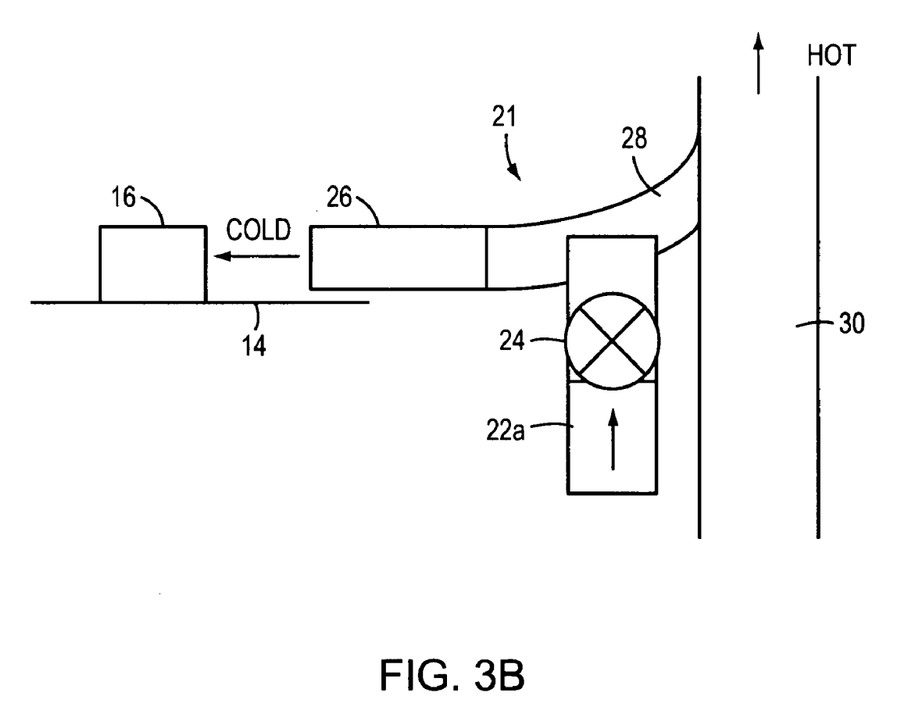

In the system shown in FIGS. 1 and 2, compressed air is input to a supply line 22. Since most data centers that house data storage devices such as that shown in FIGS. 1 and 2 already have compressed air supplies available, for use with tools and cleaning devices, for example, the current supply can be used in the present system. Supply line 22 feeds the compressed air to a valve 24, FIG. 3A, of each of vortex tube devices 20 through a sub-supply line 22a, FIG. 2. The resulting cold air is output through cold air tube 26 of the vortex tube device 20 and directed at, in particular, each CPU 16 of each module 14. The cold air carries the heat generated by the components across each module to the chimney section 18, where it is exhausted from the cabinet 12 through duct 19. The resulting hot air is output through hot air tube 28 and exhaust plenum 29 of the vortex tube device 20 into an exhaust line 30 of the system. The exhaust line 30 runs up the front of the cabinet 12 and across the top, where it exhausts the hot air into the chimney section 18. As shown in FIG. 2, exhaust line 30a receives hot air from the vortex tube devices on the left side of the cabinet and exhaust line 30b receives hot air from the vortex tube devices on the right side of the cabinet. An alternative embodiment of a vortex tube device is shown at 21 in FIG. 3B. In this embodiment, the vortex tube is curved to enable hot air tube 28 to interface with exhaust line 30 in a manner that provides less pressure drop and a shorter run from the vortex tube to the exhaust line 30.

In the embodiment, such as that shown in FIGS. 1 and 2, the cabinet 12 includes the plumbing and fixture connectors necessary to attach the compressed air to the supply line 22 of the system 10. Further, since the modules 14 are installed in the cabinet by inserting them into the cabinet 12 from the rear of the cabinet, i.e., through chimney section 18, toward the front of the cabinet, when the module 14 is inserted into the cabinet, it is electrically connected to the cabinet, in a manner known in the art, and also put into place in the proper location to enable the vortex tube devices 20 to direct the cold air at the CPUs 16 on the modules 14. This enables the cool air to be output from the vortex tube devices 20 directly at the components that generate the most heat on the module, i.e., CPUs 16. This negates the need to cool the entire cabinet, as is the case with fans, thus saving on energy costs required by the fans.

Vortex tube devices are capable of outputting a wide temperature range of cold air from the cold air tube. In operation, the temperature of the air exiting from both the cold and hot tubes will vary based on the amount of air input to the supply line. Generally, the higher the pressure, the colder the air output from the cold air tube and the hotter the air output from the hot air tube. Therefore, for a given size vortex tube device, the Delta T, the desired temperature drop between the ambient temperature and the cold air temperature, is directly related to the amount of air flowing in the supply line.

In an embodiment of the invention, the CPUs 16 operate at 80 watts. In order to have a Delta T of, for example, 27° C., the approximate air flow requirement W to a single vortex tube is calculated as follows:

$$W(\text{air flow}) = Q/(\text{delta } T * Cp), \quad [\text{Eq. 1}]$$

Where

W=airflow lb/m;

Q=heat=80 watts*3.413 btu/hr/watt=273.04 btu/hr;

Delta T of cooling air=27° C.; and

Cp=specific heat of air=0.239 btu/lb.

Based on Equation 1:

$$W = 273.04/(27 * 60 \text{ min/hr} * 0.239)$$

$$W = 0.705 \text{ lb/m}$$

Dividing by air density gives:

$$W = 0.705 \text{ lb/m}/0.0766 \text{ lb/ft3} = 9.2 \text{ cubic feet/minute (CFM)}.$$

Therefore, the total airflow required through a single vortex tube to provide cold at 27° C. below ambient temperature is 9.2 CFM of air. Accordingly, in the case where cabinet 12 includes 16 modules 14, each including 2 CPUs 16, the total airflow to supply line 22 is 9.2 CFM*32=approximately 294 CFM. Of course, the pressure of the air in the supply line 22 will depend on the diameter of the supply line 22.

Figure 4:
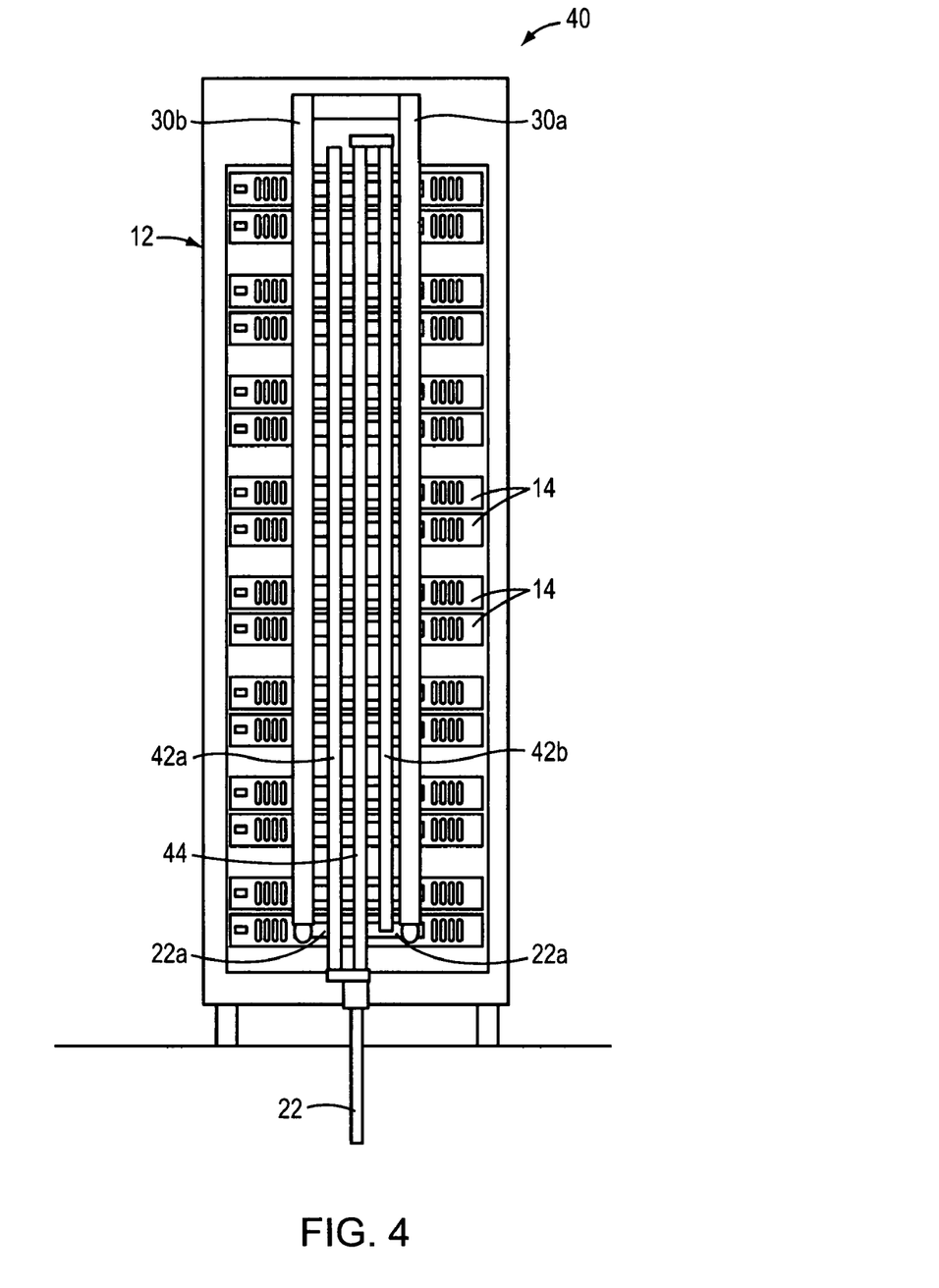
FIG. 4 is a diagram of a front view of another embodiment of the cooling system for a data storage system in accordance with the present invention.

In order to minimize a potential pressure drop as the air in supply line 22 flows to the vortex tube devices 20 through sub-supply lines 22a from the bottom of the cabinet to the top, a system 40, shown in FIG. 4, may be utilized. System 40 includes a supply line 22. However, once the air is input to the cabinet 12, supply line 22 splits into lines 42a and 44. Line 44 travels to the top of cabinet 12 and feeds into line 42b, which returns to the lower portion of the cabinet. In this embodiment, lines 42a and 42b supply air to the sub-supply lines 22a. Line 44 only carries the air to the top of line 42b. In this arrangement, a potential pressure drop will be from the bottom to the top of line 42a, and from the top to the bottom of line 42b. The balancing of the pressure drops in this manner operates to keep the air flow across each module 14 consistent.

Alternatively, the supply line 22 in FIG. 1 could be tapered as it extends up through the cabinet, to compensate for any pressure drop that may occur between the bottom and top of the supply line. Other means of compensating for a pressure drop in the supply line will be obvious to those of skill in the art and are contemplated as potential embodiments herein.

Figure 5:
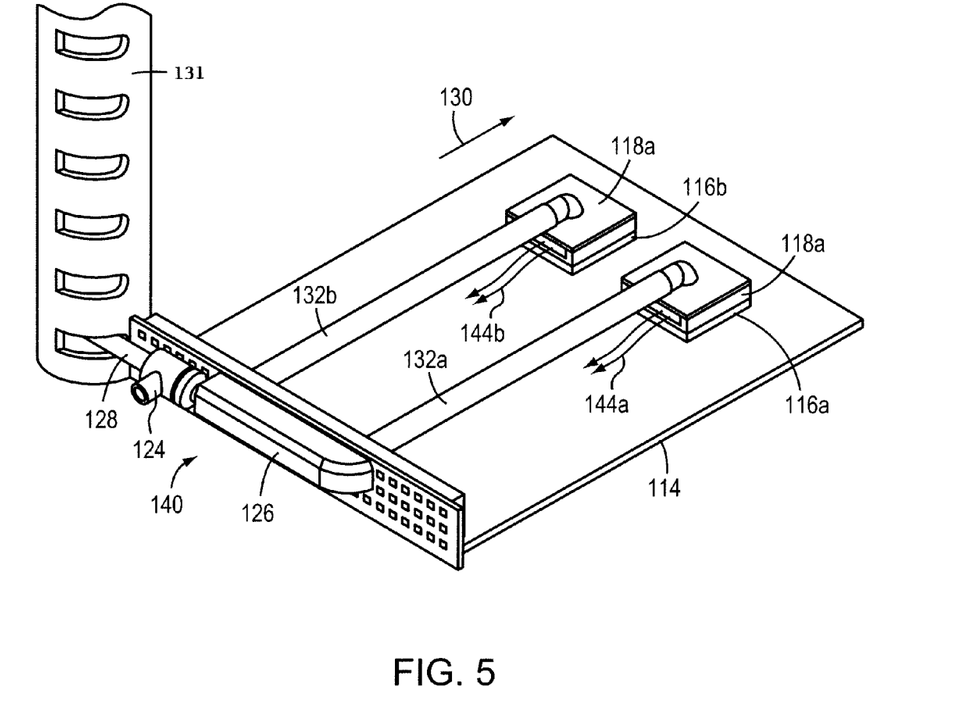
FIG. 5 is a diagram of a perspective view of another embodiment of the cooling system for a data storage system in accordance with the present invention.
Figure 6:
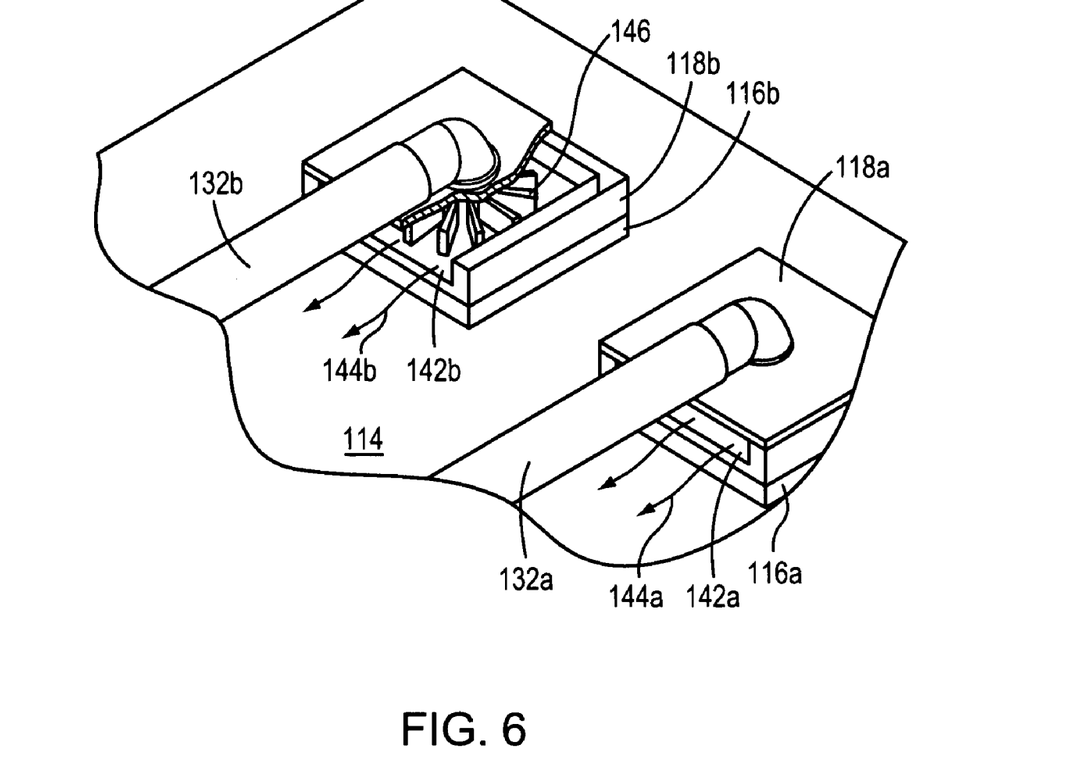
FIG. 6 is a diagram of another perspective view of the embodiment of the cooling system shown in FIG. 5 in accordance with the present invention.

Another embodiment of the invention is shown in FIGS. 5 and 6. This embodiment includes a storage processor module 114, similar to those shown in FIGS. 1 and 2. However, rather than having the vortex tube devices attached to the cabinet as in FIGS. 1 and 2, a vortex tube device 140 is mounted on the module 114. In FIG. 5, only CPUs 116a and 116b are shown for simplicity, however, it will be understood that many more components are mounted on each module 114 in a data storage system. Vortex tube device 140 includes an air inlet 124, a hot air tube 128 and a cold air distribution manifold 126. Cold air tube 132a delivers cold air from cold air distribution manifold 126 to CPU 116a and cold air tube 132b delivers cold air from cold air distribution manifold 126 to CPU 116b. Mounted on each CPU 116a, 116b is a cold air plate 118a, 118b, to which cold air tubes 132a, 132b are coupled, respectively.

With this embodiment, the module 114 is inserted into the cabinet from the rear in the direction shown by arrow 130. The necessary electrical connections (not shown) are made to the cabinet at the front of the cabinet, at the end of module 114 opposite the vortex tube device 140. The air inlet 124 is mated to an air supply line (not shown), and hot air tube 128 is mated with exhaust line 131, which is located within the chimney section 18, and directs the hot air out of the cabinet through duct 19.

As shown in FIG. 6, cold air tubes 132a, 132b deliver cold air from cold air distribution manifold 126 to their respective cold air plates 118a, 118b. For purposes of describing the cold air plates, the top portion of cold air plate 118b is transparently shown. The purpose of the cold air plates is to retain the cold air and distribute it over the surface of the CPU before it is forced out of the cold plate through openings 142a, 142b in the direction of arrows 144a, 144b. The air that exits cold plates 118a, 118b flows toward the rear of the cabinet and provides cooling to components (not shown) downstream from the CPUs 116a, 116b, between the CPUs and the vortex tube device 140. Cold plate 118b includes a baffle 146 which causes the cold air input to cold plate 118b through cold air tube 132b to be distributed over the surface of the CPU 116b. Baffle 146 includes radial fins for directing the cold air over the surface of the CPU 116b.

Figure 7:
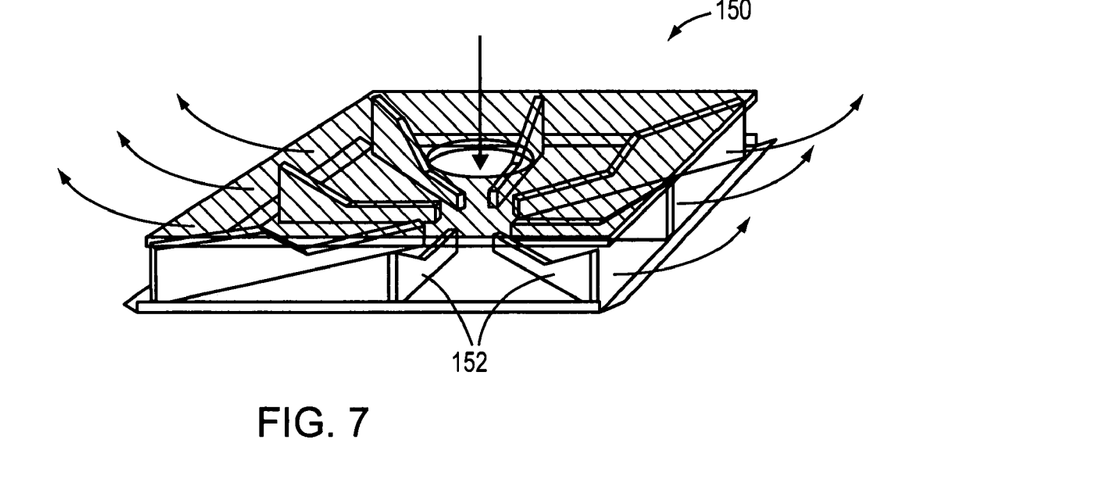
FIGS. 7 and 8 are diagrams showing perspective views of the heat sink component of the embodiment of the cooling system shown in FIG. 5 in accordance with the present invention.
Figure 8:
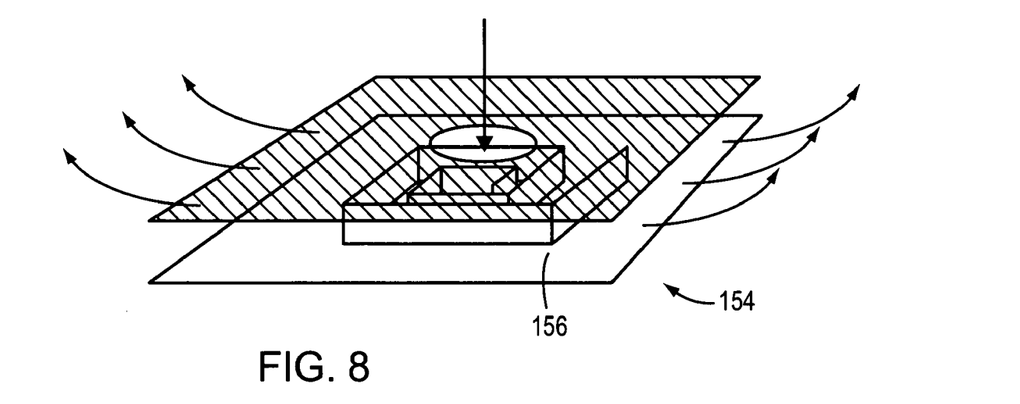

FIGS. 7 and 8 show further embodiments of cold air plates for providing cold air to the surface of the associated CPU. FIG. 7 shows a cold air plate 150 having radial fins 152 for distributing the cold air over the surface of the CPU (not shown). However, cold air plate 150 has four open sides for allowing the air to escape there from. FIG. 8 shows a cold air plate 154 having a spiral structure 156 for retaining the cold air and distributing it over the surface of the CPU (not shown) before it is forced out of the cold plate through openings on one or more sides thereof.

Accordingly, the invention provides a system for cooling electronic components. Utilizing vortex tube devices to direct air over heat-generating components provides many advantages over prior art fan systems. The system enables spot cooling of components on the modules, in which the cold air is supplied directly to the heat-generating components that require cooling. This negates the need to cool the entire cabinet, as was required in prior art fan system, which reduces power consumption and noise levels within the data center. Furthermore, prior art fan systems required that large heat sinks be mounted to the heat-generating components to maximize the transfer of heat from the components to the air flow from the fans. Although heat sinks on the components may still be utilized in the present invention for facilitating heat transfer, the present invention reduces the need for such large heat sinks by directing cold air (rather than ambient air) directly over the components. The lack of such large heat sinks in the present invention reduces the amount of space required on the board.

By directing cold air over the heat-generating components, rather than ambient air in the prior art systems, the components can be cooled to temperatures below the ambient temperature, which enables the components to operate at increased frequencies, resulting in improved performance and increased reliability.

As described above, the vortex tube devices only require compressed air to operate. Compressed air can be generated in any number of environmentally friendly ways, including with the use of windmills, hydro power, wave and tide action and by using off-peak electricity. The compressed air can be stored for later use. The use of $CO_2$ in the system is advantageous, as it has a higher heat capacity than compressed air, making it more efficient. A $CO_2$ supply can also be combined with a fire suppressant system for the data center that utilizes $CO_2$. Furthermore, $CO_2$ may be used in a closed loop system, in which exhaust from the cabinet is captured, and reused.

In order to provide redundant cooling, multiple compressed air tanks or compressors can be utilized to feed a common supply line. In the event that one compressor fails, the other compressor can be used to continue the supply of compressed air to the system. Since the vortex tube devices have no moving parts and do not require power, there is very little likelihood of a failure in the system, unlike prior art fan systems.

In another embodiment of the invention, each CPU may be configured to monitor its own temperature and control the valve of the vortex tube device to decrease or increase the temperature of the cold air being directed over it by the vortex tube device. For example, if a processor detected that its temperature was rising or that its operating frequency was decreasing, it would instruct the valve of the vortex tube device to open to allow increased air passage there through, resulting in colder air being output from the cold air tube of the vortex tube device.

The invention may be embodied in other specific forms without departing from the spirit or essential characteristics thereof. For example, while the invention has been described as an alternative to prior art fan cooling systems, the invention could also be used as a supplement or backup to fans. In the event of extra hot days or impending thermal overload due to, for example failure of the air conditioning system in the data center, the vortex tube cooling system could be used to supplement the fans to provide extra cooling. In the event of a failure of one or more fans in a fan cooling system, the vortex tube cooling system could be used to provide supplemental cooling to make up for the loss of the fans. Furthermore, although the invention has been described in connection with a data storage system, it will be understood that the cooling system of the invention may be utilized for cooling heat-generating electronic components in any type of computer system. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

The invention claimed is:

1. A system for cooling electronic components comprising:
    a cabinet having a board housing portion and a discrete chimney portion, the chimney portion for exhausting heat through an upper surface of the cabinet;
    a plurality of boards, each board having at least one heat-generating electronic components mounted thereon, each board being removably mountable in the board housing portion of the cabinet; and a plurality of vortex tube devices, each vortex tube device including an input for receiving compressed air, a cold air output and a hot air output, and being mounted in the board housing portion of the cabinet such that, when compressed air is input to each of the vortex tube devices, cold air is respectively directed at the heat-generating electronic components from the cold air output of each of the vortex tube devices to cool the heat-generating electronic components;
    wherein heat from the heat-generating electronic components is directed to the chimney from each of the plurality of boards for exhaustion from the cabinet; and
    wherein the cabinet further includes an exhaust device for transporting heat from the hot air output of each vortex tube device to the chimney for exhaustion from the cabinet.

2. The system of claim 1 further comprising a plurality of ducts, each coupled between the cold air output of a corresponding vortex tube device and an air distribution device mounted on at least one of the heat-generating electronic components for directing cold air output from the corresponding vortex tube device to the air distribution device.

* * * * *